(12) United States Patent
Pandey et al.

(10) Patent No.: US 6,264,789 B1
(45) Date of Patent: Jul. 24, 2001

(54) SYSTEM FOR DISPENSING POLISHING LIQUID DURING CHEMICAL MECHANICAL POLISHING OF A SEMICONDUCTOR WAFER

(75) Inventors: Sumit Pandey; Fen Fen Jamin, both of Wappingers Falls, NY (US)

(73) Assignees: Infineon Technologies Corp., Cupertino, CA (US); International Business Machines, Armonk, NY (US)

( * ) Notice: Subject to any disclaimer, the term of this patent is extended or adjusted under 35 U.S.C. 154(b) by 0 days.

(21) Appl. No.: 09/562,218

(22) Filed: Apr. 28, 2000

Related U.S. Application Data

(62) Division of application No. 09/315,090, filed on May 19, 1999, now Pat. No. 6,225,224.

(51) Int. Cl.[7] .................................................. B24B 37/00
(52) U.S. Cl. ........................ 156/345; 451/56; 451/59; 451/60; 451/303; 451/307; 451/91; 438/692
(58) Field of Search .......................... 438/692; 451/41, 451/56, 59, 303, 307, 60; 156/345

(56) References Cited

U.S. PATENT DOCUMENTS

| | | | |
|---|---|---|---|
| 5,877,088 | * | 3/1999 | Samitsu et al. ................. 438/692 |
| 5,985,094 | * | 11/1999 | Mosca ................................ 156/345 |
| 5,993,293 | * | 11/1999 | Cesna et al. ........................ 451/41 |
| 6,012,964 | * | 1/2000 | Arai et al. ............................ 451/5 |
| 6,015,754 | * | 1/2000 | Mase et al. ...................... 438/692 |
| 6,027,398 | * | 2/2000 | Numoto et al. .................. 451/285 |
| 6,033,290 | * | 3/2000 | Gurusamy et al. ................ 451/56 |
| 6,036,587 | * | 3/2000 | Tolles et al. ..................... 451/288 |
| 6,051,499 | * | 4/2000 | Tolles et al. ..................... 438/692 |
| 6,135,859 | * | 10/2000 | Tietz ................................. 451/307 |

* cited by examiner

Primary Examiner—Matthew Smith
Assistant Examiner—V. Yevsikov
(74) Attorney, Agent, or Firm—Stanton C. Braden

(57) ABSTRACT

A system is provided for chemical mechanical polishing (CMP) of a semiconductor wafer by periodically relatively moving a polishing pad on a rotating platen, and the wafer, retained in the aperture of a rotating and oscillating ring having a wear surface surrounding the aperture and wafer, with respect to each other while the wafer and wear surface frictionally contact the pad. A CMP slurry is dispensed to the wafer periphery in the vicinity of the pad at a plurality of perimetrically spaced apart channels in the wear surface maintained in fixed relation to the wafer during the relative movement. The ring is fixed to the underside of a carrier in turn fixed at its upper portion to the bottom end of a spindle which is rotatably mounted at its top end on an oscillating support beam, such that the wafer, ring, carrier and spindle rotate and oscillate in common. The carrier has a heat exchanger to heat or cool the slurry. Passages in the spindle flow connected with conduits in the carrier correspondingly supply the slurry to the ring channels, temperature adjusting fluid to and from the heat exchanger, and pressure fluid, e.g., air, to the inner side of the wafer in the ring aperture, respectively, during common rotation and oscillation of the wafer, ring, carrier and spindle.

22 Claims, 4 Drawing Sheets

SYSTEM FOR DISPENSING POLISHING LIQUID DURING CHEMICAL MECHANICAL POLISHING OF A SEMICONDUCTOR WAFER

This is a divisional of application Ser. No. 09/315,090 filed May 19,1999 now U.S. Pat. No. 6,225,224.

This invention relates to a system, including a method and an apparatus, for dispensing polishing liquid during chemical mechanical polishing (CMP) of a semiconductor wafer, e.g., of silicon, and more particularly, to such a system for feeding a polishing liquid to the wafer surface periphery in the vicinity of a polishing surface during relative periodic movement between such surfaces, especially while also adjusting the temperature of the polishing liquid in the vicinity of the wafer.

As used herein, "semiconductor wafer" means any microelectronic device, substrate, chip or the like, e.g., of silicon, used to provide an integrated circuit or other related circuitry structure subject to chemical mechanical polishing procedures such as for achieving planarization over an entire surface of the wafer.

BACKGROUND OF THE INVENTION

In fabricating microelectronic semiconductor devices and the like on a wafer substrate or chip, e.g., of silicon, to form an integrated circuit (IC), etc., various metal layers and insulation layers are deposited in selective sequence. To maximize integration of device components in the available substrate area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions.

One type of wet chemical process used in the IC fabrication of a semiconductor wafer concerns the chemical mechanical polishing (CMP) of a surface of the wafer against a polishing pad during relative periodic movement therebetween, such as with a caustic slurry containing finely divided abrasive particles, e.g., colloidal silica in an aqueous potassium hydroxide (KOH) solution, as the polishing liquid. This removes, i.e., by chemical etching and mechanical abrasion, a thin layer of material, e.g., of 1 micron or less thickness, so as to planarize a top surface of the wafer. Close control of the slurry flow rate, temperature and pH are necessary to attain in a reproducible manner a uniform removal rate per the CMP operation.

The conventional CMP process involves introducing the slurry from a stationary overlying tube dropwise onto a polishing pad of a rotating table (platen) which rotates about a stationary platen axis and against which the wafer, which is carried by a retaining ring, makes frictional contact while the wafer and ring rotate and oscillate relative to the platen. The wafer is positioned in a medial aperture of the ring such that the ring also makes frictional contact with the polishing pad. As the position of the wafer relative to the platen varies during wafer rotation and oscillation, the slurry dispensing tube is always spaced a minimum clearance distance from the wafer.

Consequently, different portions of the wafer necessarily encounter dispensed slurry droplets having different thermal histories. This depends on the continuously varying distance between the relative position of rotation and oscillation of the wafer, and in particular of its leading and trailing edges during oscillation, and the position of the centrifugally outwardly travelling slurry droplets dispensed onto the rotating platen from the stationary tube. As a result, the operating temperature at the local polishing site of the wafer is non-uniform, leading to non-uniformity of the CMP operation.

Also, some of the slurry on the polishing pad is pushed off the platen by the retaining ring which surrounds the wafer, inasmuch as the ring is also in frictional contact with the pad and in some cases is pressed under positive mechanical pressure thereagainst. This loss of slurry constitutes wastage which increases operating costs. By its inherent wafer-captively surrounding arrangement, the retaining ring also impedes flow of slurry to the central area of the wafer surface being polished. This causes poor center-to-edge uniformity, further detracting from the uniformity of the CMP operation.

Where the process requires heating of the slurry, such as in the case of polysilicon CMP, then a separate heating module, which occupies expensive floor space (module footprint), must be provided to supply heated slurry to the tube for dispensing.

The above prior art drawbacks cause adverse variation in the local removal rate of wafer material from different parts of the wafer due to variation in the amount and temperature of the slurry coming into contact with the wafer surface being polished. This diminishes the degree of within-wafer uniformity. Also, slurry wastage increases its consumption rate and cost.

It is desirable to have a system, including a method and an apparatus, permitting CMP operations to be performed on a semiconductor wafer under reproducible uniform conditions of polishing liquid temperature, polishing liquid dispensing flow rate, and supplying of polishing liquid locally to all portions of the wafer regardless of its relative position of movement with respect to the platen polishing pad, and optionally also under reproducible uniform conditions of selective temperature adjustment of the polishing liquid in the vicinity of the wafer.

SUMMARY OF THE INVENTION

The foregoing drawbacks are obviated in accordance with the present invention by providing a system, including a method and an apparatus, which permits chemical mechanical polishing (CMP) operations to be performed on a semiconductor wafer, e.g., of silicon, under reproducible uniform conditions of polishing liquid temperature, polishing liquid dispensing flow rate, and supplying of polishing liquid locally to all portions of the wafer regardless of its relative position of movement with respect to the platen polishing pad, and optionally also under reproducible uniform conditions of selective temperature adjustment of the polishing liquid in the vicinity of the wafer.

The system of the invention minimizes variation in the local removal rate of material from different parts of the wafer being polished since the CMP operation is carried out so as to limit variation in the amount and temperature of the polishing liquid coming into contact with the wafer surface being polished. This improves, i.e., increases, the degree of within-wafer uniformity attainable. Polishing liquid wastage is avoided, so that its consumption rate and cost are reduced to a minimum.

Furthermore, the need for a stand-alone polishing liquid heating module is eliminated, thereby conserving floor space.

According to a first aspect of the invention, a method is provided for CMP of a surface of a semiconductor wafer having a surface periphery. The method comprises periodically relatively moving a substantially flat polishing surface and the wafer with respect to each other while maintaining the wafer surface in frictional contact with the polishing surface, and dispensing a chemical mechanical polishing liquid to the wafer surface periphery in the vicinity of the polishing surface. The dispensing is effected at a plurality of perimetrically spaced apart points maintained in fixed relation to the wafer surface periphery during the relative periodic movement.

The polishing liquid may be, e.g., a caustic aqueous slurry containing finely divided abrasive particles, such as an aqueous potassium hydroxide (KOH) slurry containing colloidal silica.

Typically, the polishing liquid is dispensed at a temperature of about 15–50° C. and the wafer surface is maintained in frictional contact with the polishing surface under a mechanical pressure of about 2–8 pounds per square inch (psi) periodic movement. More specifically, the adjusting comprises heating the polishing liquid to a selective elevated temperature, such as about 25–50° C., in the vicinity of the wafer surface and in fixed relation thereto during the relative periodic movement, especially while maintaining the wafer surface in frictional contact with the polishing surface under a mechanical pressure of about 2–8 psi.

In particular, the polishing surface is in the form of a rotating platen which is rotated at a first selective rotational speed, such as about 25–100 revolutions per minute (rpm), about a platen axis. Concordantly, the wafer is rotated at a second selective rotational speed, such as about 25–100 rpm, and especially within about 5 rpm above or below the rotational speed of the platen, about a wafer axis spaced from and substantially parallel to the platen axis. The wafer is also oscillated relative to the platen axis at a selective frequency and amplitude, such as at a frequency of about 3–8 cycles per minute (cpm) and an amplitude of about 10–30 mm.

According to another preferred feature, the wafer is perimetrically retained in a retaining ring. The ring has a wear surface surrounding the wafer surface and in substantially flush coplanar relation with the wafer surface for common rotation and oscillation therewith. The polishing liquid is dispensed to the wafer surface periphery from a plurality of perimetrically spaced apart fixed points on the ring.

With regard to a particular embodiment, the method comprises periodically relatively moving a platen having a substantially flat polishing surface and the semiconductor wafer with respect to each other by rotating the platen at a first selective rotational speed about a platen axis and the wafer at a second selective rotational speed about a wafer axis spaced from and substantially parallel to the platen axis while oscillating the wafer relative to the platen axis at a selective frequency and amplitude and also while maintaining the wafer surface in frictional contact with the polishing surface. At the same time, a chemical mechanical polishing liquid is dispensed to the wafer surface periphery in the vicinity of the polishing surface at a plurality of perimetrically spaced apart points maintained in fixed relation to the wafer surface periphery during the relative periodic movement.

The wafer surface is typically oscillated radially relative to the platen axis to move the wafer axis toward and away from the platen axis.

Advantageously, the wafer is perimetrically retained in a retaining ring having a wear surface surrounding the wafer surface and in substantially flush coplanar relation with the wafer surface for common rotation and oscillation therewith. Thus, the polishing liquid may be dispensed to the wafer surface periphery from a plurality of perimetrically spaced apart fixed points on the ring.

The method preferably further comprises selectively adjusting the temperature of the polishing liquid in the vicinity of the wafer surface and in fixed relation thereto during the relative periodic movement, the adjusting being effected adjacent the retaining ring. The adjusting may comprise heating the polishing liquid to a selective elevated temperature, such as about 25–50° C., in the vicinity of the wafer surface and in fixed relation thereto during the relative periodic movement. The heating is effected adjacent the retaining ring, especially while maintaining the wafer surface in frictional contact with the polishing surface under a mechanical pressure of about 2–8 psi.

According to a second aspect of the invention, an apparatus is provided for CMP of a surface of a semiconductor wafer having a surface periphery.

The apparatus comprises a retaining ring having a medial aperture and a peripheral wear surface perimetrically surrounding the aperture, and a plurality of perimetrically spaced apart channels defined in the wear surface. The ring aperture is adapted to retain therein for common movement with the ring a semiconductor wafer having a surface to be chemically mechanically polished, such that the wafer surface is in substantially flush coplanar relation with the wear surface and is peripherally surrounded by the wear surface. The wear surface channels are provided for dispensing respective flows of a CMP liquid to the corresponding adjacent portions of the periphery of the wafer surface.

The ring is typically formed of sacrificially consumable plastic or ceramic abradable material.

According to a preferred feature, the apparatus comprises a carrier in combination with said retaining ring and wear surface channels. The carrier is adapted to be mounted for relative periodic movement with respect to a substantially flat polishing surface and has an upper portion, a lower portion defining an underside portion and a polishing liquid conduit extending from the upper portion to the lower portion thereof. The retaining ring is mounted on the underside portion of the carrier for common movement therewith, and the wear surface channels are arranged in common flow communication with the polishing liquid conduit of the carrier.

The apparatus preferably further comprises temperature adjusting means in the carrier for selectively adjusting the temperature of a flow of polishing liquid in the polishing liquid conduit. The temperature adjusting means desirably comprise heat exchanger means, and a temperature adjusting fluid inflow conduit extending from the upper portion of the carrier to the heat exchanger means and a temperature adjusting fluid outflow conduit extending from the heat exchanger means to the upper portion of the carrier. The fluid inflow and outflow conduits serve for passing a flow of temperature adjusting fluid in indirect heat exchange relation to the flow of polishing liquid in the polishing liquid conduit for such temperature adjustment.

According to another preferred feature, the apparatus comprises a spindle in combination with said carrier, retaining ring and wear surface channels. The spindle is adapted to be mounted for relative periodic movement with respect to a substantially flat polishing surface and has a top end, a bottom end and a polishing liquid passage extending from the top end to the bottom end thereof. The carrier is mounted on the bottom end of the spindle for common movement therewith and with its upper portion in contact with the bottom end of the spindle and its polishing liquid conduit in flow communication with the polishing liquid passage of the spindle.

With regard to a particular heat exchanger embodiment, the apparatus comprises a spindle and a carrier of specific construction in combination with said retaining ring and wear surface channels.

The spindle is adapted to be mounted for relative periodic movement with respect to a substantially flat polishing surface and has a top end, a bottom end, a polishing liquid passage, a temperature adjusting fluid inflow passage and a temperature adjusting fluid outflow passage, each of such passages extending from the top end to the bottom end of the spindle.

The carrier is mounted on the bottom end of the spindle for common movement therewith and has an upper portion in contact with the bottom end of the spindle, a lower portion defining an underside portion, and heat exchanger means. A polishing liquid conduit extends from the upper portion of the carrier through the heat exchanger means to the lower portion of the carrier and is in flow communication with the polishing liquid passage of the spindle. A temperature adjusting fluid inflow conduit extends from the upper portion of the carrier to the heat exchanger means and is in flow communication with the fluid inflow passage of the spindle, and a temperature adjusting fluid outflow conduit extends from the heat exchanger means to the upper portion of the carrier and is in flow communication with the fluid outflow passage of the spindle.

The heat exchanger means is arranged for passing a flow of temperature adjusting fluid via the fluid inflow passage and fluid inflow conduit and in turn the fluid outflow conduit and fluid outflow passage in indirect heat exchange relation to the flow of polishing liquid in the polishing liquid conduit for selectively adjusting the temperature of the polishing liquid in the carrier.

The retaining ring is mounted on the underside portion of the carrier for common movement therewith and the wear surface channels are arranged in common flow communication with the polishing liquid conduit of the carrier.

The apparatus may further comprise a pressure fluid passage extending from the top end to the bottom end of the spindle, and a pressure fluid conduit extending from the upper portion to the lower portion of the carrier and flow communicating with the pressure fluid passage of the spindle and with the underside portion of the carrier within the confines of the aperture of the ring. The pressure fluid passage and pressure fluid conduit serve for feeding a flow of pressure fluid, such as compressed air, to the adjacent portion of a semiconductor wafer retained in the aperture of the ring at the underside portion of the carrier for maintaining the wafer in substantially flush coplanar relation with the wear surface of the ring.

According to a further preferred feature, the apparatus comprises a circular platen and a support beam in combination with said spindle, carrier, retaining ring and wear surface channels. The circular platen is mounted for rotation about a platen axis and has a substantially flat polishing surface, and the support beam is arranged for oscillation in a direction toward and away from the platen axis and rotatably mounts the spindle at its top end for rotation about a spindle axis spaced from and substantially parallel to the platen axis. The carrier is mounted on the bottom end of the spindle for common movement therewith and has its upper portion in contact with the bottom end of the spindle and its polishing liquid conduit in flow communication with the polishing liquid passage of the spindle.

The retaining ring is mounted on the underside portion of the carrier for common movement therewith and the wear surface channels are arranged in common flow communication with the polishing liquid conduit of the carrier.

The support beam is adjustably arranged to place the wear surface of the ring in frictional contact with the polishing surface of the platen for CMP of a surface of a semiconductor wafer retained in the ring aperture during relative periodic movement of the wafer and ring with respect to the platen, i.e., under rotation of the platen and common rotation and oscillation of the wafer and ring.

The apparatus further comprises flow connection means for supplying a flow of polishing liquid from a non-rotating supply to the polishing liquid passage of the spindle during rotation and oscillation of the spindle.

The apparatus may further comprise said pressure fluid passage extending from the top end to the bottom end of the spindle, and said pressure fluid conduit extending from the upper portion to the lower portion of the carrier and flow communicating with the pressure fluid passage of the spindle and with the underside portion of the carrier within the confines of the aperture of the ring. In this case, the flow connection means are provided for supplying both a flow of polishing liquid from a non-rotating supply to the polishing liquid passage of the spindle and a flow of pressure fluid from a non-rotating supply to the pressure fluid passage of the spindle during rotation and oscillation of the spindle.

In accordance with an overall embodiment, the apparatus comprises a specific construction of the circular platen, support beam, spindle, carrier, retaining ring and wear surface channels.

The circular platen is mounted for rotation about a platen axis and has a substantially flat polishing surface. The spindle has a top end, a bottom end, a polishing liquid passage, a temperature adjusting fluid inflow passage and a temperature adjusting fluid outflow passage, each of said passages extending from the top end to the bottom end of the spindle. The support beam is arranged for oscillation in a direction toward and away from the platen axis and rotatably mounts the spindle at its top end for rotation about a spindle axis spaced from and substantially parallel to the platen axis. The carrier is mounted on the bottom end of the spindle for common movement therewith.

The carrier has an upper portion in contact with the bottom end of the spindle, a lower portion defining an underside portion, heat exchanger means, a polishing liquid conduit extending from the upper portion of the carrier through the heat exchanger means to the lower portion of the carrier and in flow communication with the polishing liquid passage of the spindle, a temperature adjusting fluid inflow conduit extending from the upper portion of the carrier to the heat exchanger means and in flow communication with the fluid inflow passage of the spindle, and a temperature adjusting fluid outflow conduit extending from the heat exchanger means to the upper portion of the carrier and in flow communication with the fluid outflow passage of the spindle.

The heat exchanger means are arranged for passing a flow of temperature adjusting fluid via the fluid inflow passage and fluid inflow conduit and in turn the fluid outflow conduit and fluid outflow passage in indirect heat exchange relation to the flow of polishing liquid in the polishing liquid conduit for selectively adjusting the temperature of the polishing liquid in the carrier.

The retaining ring is mounted on the underside portion of the carrier for common movement therewith and has a medial aperture and a peripheral wear surface perimetrically surrounding the aperture. The aperture is adapted to retain therein for common movement with the ring a semiconductor wafer having a surface to be chemically mechanically polished, such that the wafer surface is in substantially flush coplanar relation with the wear surface and is peripherally surrounded by the wear surface.

The plurality of perimetrically spaced apart channels defined in the wear surface serve for dispensing respective flows of a chemical mechanical polishing liquid to the corresponding adjacent portions of the periphery of the wafer surface, the channels being arranged in common flow communication with the polishing liquid conduit of the carrier.

The support beam is adjustably arranged to place the wear surface of the ring in frictional contact with the polishing surface of the platen for CMP of a surface of a semiconductor wafer retained in the ring aperture during relative periodic movement of the wafer and ring with respect to the platen under rotation of the platen and common rotation and oscillation of the wafer and ring.

The apparatus further comprises flow connection means for supplying a flow of polishing liquid from a non-rotating supply to the polishing liquid passage of the spindle, for supplying an inflow of temperature adjusting fluid from a non-rotating supply to the fluid inflow passage of the spindle and for removing an outflow of such temperature adjusting fluid from the fluid outflow passage of the spindle to a non-rotating outlet, during rotation and oscillation of the spindle.

The apparatus may also comprise a pressure fluid passage extending from the top end to the bottom end of the spindle, and a pressure fluid conduit extending from the upper portion to the lower portion of the carrier and flow communicating with the pressure fluid passage of the spindle and with the underside portion of the carrier within the confines of the aperture of the ring. The pressure fluid passage and pressure fluid conduit are used for feeding pressure fluid to the adjacent portion of a semiconductor wafer retained in the aperture at the carrier underside portion to maintain the wafer in substantially flush coplanar relation with the ring wear surface.

Accordingly, the flow connection means will then also contemplate the supplying of a flow of pressure fluid from a non-rotating supply to the pressure fluid passage of the spindle during rotation and oscillation of the spindle.

The invention will be more readily understood from the following detailed description taken with the accompanying drawings and claims.

It is noted that the drawings are not to scale, some portions being shown exaggerated to make the drawings easier to understand.

DETAILED DESCRIPTION

Figure 1:
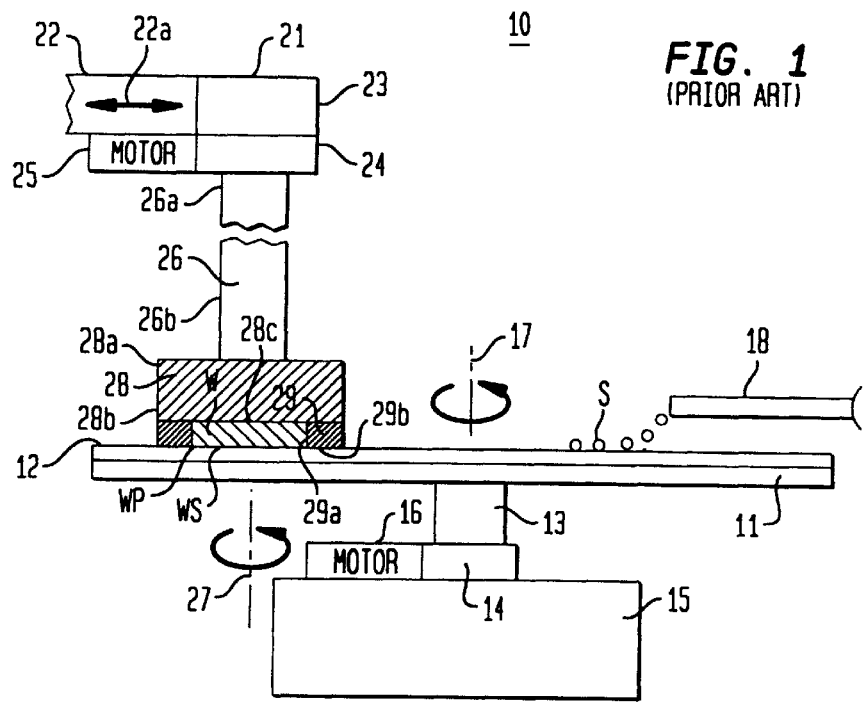
FIG. 1 is a side view, partially in section, of a prior art apparatus for chemical mechanical polishing of a semiconductor wafer.
Figure 2:
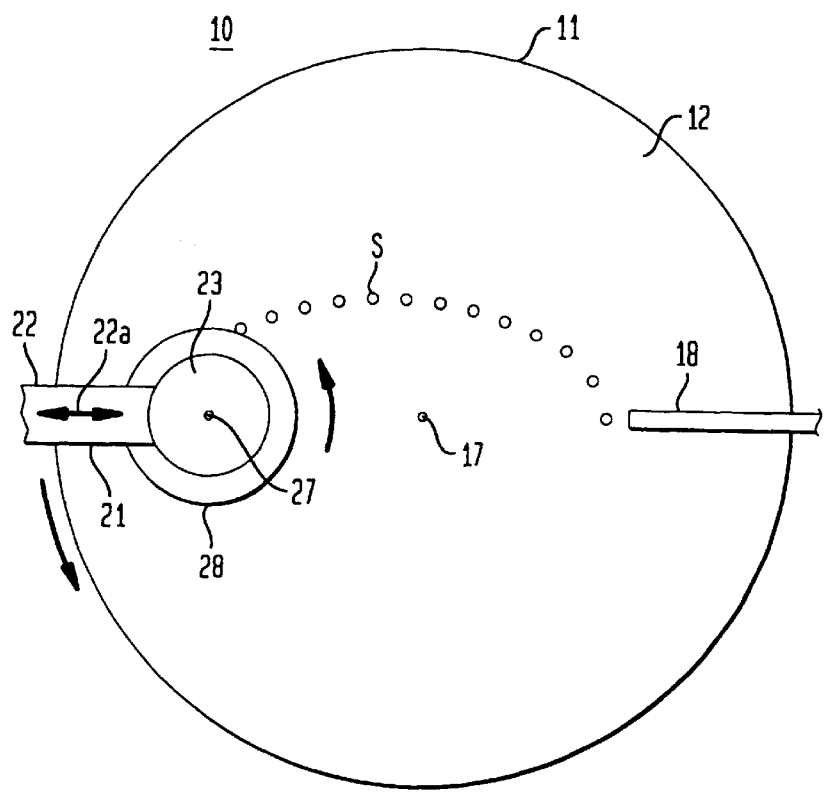
FIG. 2 is a top view of the prior art apparatus of FIG. 1.
Figure 3:
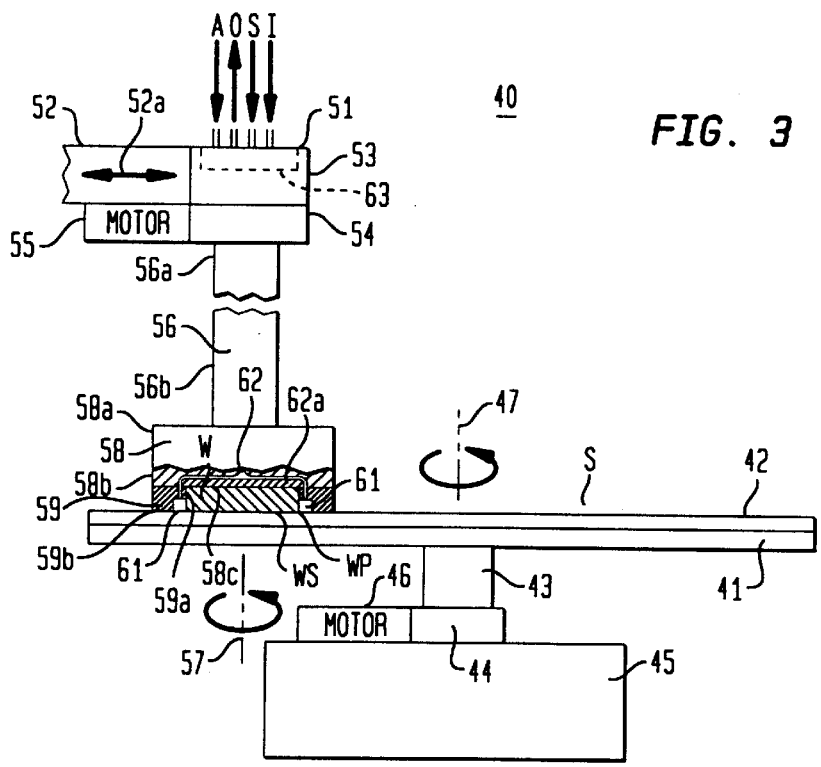
FIG. 3 is a side view, partially in section, of an apparatus for chemical mechanical polishing of a semiconductor wafer in accordance with the present invention.
Figure 4:
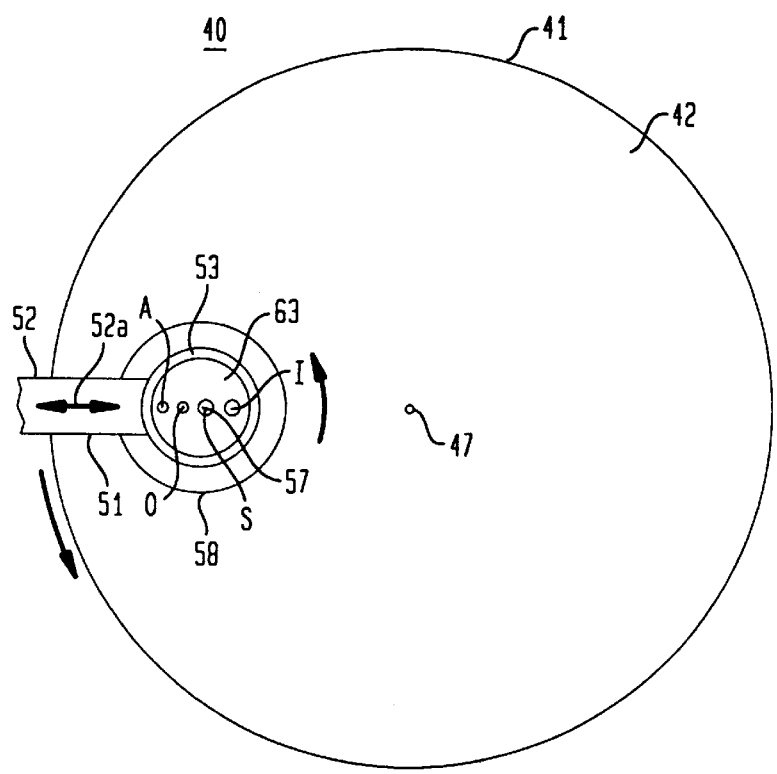
FIG. 4 is a top view of the apparatus of FIG. 3.

Referring now to FIGS. 1 and 2, there is shown an apparatus 10 for chemical mechanical polishing of a surface WS of a semiconductor wafer W having a surface periphery WP in accordance with the prior art. The apparatus 10 comprises a platen 11, a polishing pad 12, a shaft 13, a gear unit 14, a base 15, a motor 16, a platen axis 17 and a tube 18 for dispensing a chemical mechanical polishing liquid (slurry) S, and a polishing unit 21 having a support beam 22, an oscillation arrow 22a, a bearing unit 23, a gear unit 24, a motor 25, a spindle 26, a spindle axis 27, a carrier 28 and a ring 29 for retaining a semiconductor wafer W having a surface WS to be polished and a surface periphery WP. The spindle 26 has a top end 26a and a bottom end 26b, the carrier 28 has an upper portion 28a, a lower portion 28b and an underside portion 28c, and the ring 29 has an aperture 29a and a wear surface 29b.

Platen 11 is typically formed as a circular disc, e.g., of aluminum, covered by polishing pad 12, e.g., of polyurethane fibrous plastic sheeting material, and is carried on shaft 13 which is mounted via gear unit 14 on base 15 for rotation by motor 16 about a stationary platen axis 17 in conventional manner. Tube 18 is stationarily located in overlying relation to platen 11 to dispense slurry S onto polishing pad 12 at a given flow rate. Polishing unit 21 is located generally diametrically opposite tube 18 with respect to platen axis 17.

Polishing unit 21 includes support beam 22 which is mounted on a base (not shown) for back and forth oscillation, e.g., in a radial direction relative to platen axis 17, as indicated by oscillation arrow 22a. Support beam 22 carries bearing unit 23, gear unit 24 and motor 25 for common oscillation therewith. Spindle 26 is mounted at its top end 26a in bearing unit 23 and gear unit 24 for rotation by motor 25 about spindle axis (wafer axis) 27 and for common oscillation with support beam 22, in conventional manner. Carrier 28 is mounted at its upper portion 28a on bottom end 26b of spindle 26 for common rotation and oscillation therewith. Lower portion 28b of carrier 28 defines underside portion 28c which carries ring 29 for common rotation and oscillation therewith.

Ring 29 has a generally medial aperture 29a and a peripheral wear surface 29b perimetrically surrounding aperture 29a. Aperture 29a is adapted to retain therein for common movement with ring 29 in conventional manner a semiconductor wafer W, e.g., of silicon, having a surface WS to be chemically mechanically polished and a surface periphery WP. Wafer W is maintained in aperture 29a and against the underside portion 28c of carrier 28 such that wafer surface WS is in substantially flush coplanar relation with wear surface 29b and is peripherally surrounded at surface periphery WP by wear surface 29b.

Support beam 22 is arranged such that wafer W and wear surface 29b of ring 29 are maintained in common frictional contact with polishing pad 12 as they are commonly rotated, e.g., counter-clockwise, and commonly oscillated, e.g., in the direction of arrow 22a, and as platen 11 is rotated in like manner, e.g., also counter-clockwise, in conventional manner, while slurry S is dispensed from tube 18 onto pad 12.

It is clear from FIGS. 1 and 2 that the conventional CMP process has the problem of different parts of wafer W encountering droplets of slurry S with different thermal histories, depending on the constantly varying distance between the rotating and oscillating wafer W, and in particular its leading and trailing oscillating edges at surface periphery WP, and the centrifugally outwardly travelling droplets of slurry S dispensed onto the rotating platen 11 from the stationary tube 18. Hence, the slurry temperature at the local polishing site of wafer W is non-uniform and so also is the CMP operation.

Inherently, some slurry S on pad 12 is pushed off platen 11 by ring 29 which surrounds wafer W, since its wear surface 29b frictionally contacts polishing pad 12, typically under positive mechanical pressure. This loss of slurry S increases operating costs. By its wafer-captively surrounding nature, ring 29 also impedes flow of slurry S to the central area of wafer surface WS, causing poor center-to-edge uniformity.

Moreover, if heating of slurry S is required, as in the case of polysilicon CMP, a separate heating module is needed.

These drawbacks of conventional CMP cause adverse variation in the local removal rate of material from different parts of wafer W due to variation in the amount and temperature of slurry S contacting wafer surface WS, thus diminishing the degree of within-wafer uniformity, while the wastage of slurry S increases operating costs.

These drawbacks are avoided in accordance with the present invention.

Referring now to FIGS. 3 to 7, there is shown an apparatus 40 for chemical mechanical polishing of a surface WS of a semiconductor wafer W having a surface periphery WP in accordance with the present invention. The apparatus 40 comprises a platen 41, a polishing pad 42, a shaft 43, a gear unit 44, a base 45, a motor 46, and a platen axis 47, and a polishing unit 51 having a support beam 52, an oscillation arrow 52a, a bearing unit 53, a gear unit 54, a motor 55, a spindle 56, a spindle axis 57, a carrier 58 and a ring 59 for retaining a semiconductor wafer W having a surface WS to be polished and a surface periphery WP. The spindle 56 has a top end 56a and a bottom end 56b, the carrier 58 has an upper portion 58a, a lower portion 58b and an underside portion 58c, the ring 59 has an aperture 59a, a wear surface 59b and channels 61 for dispensing a chemical mechanical polishing liquid (slurry) S, the carrier 58 also has a slurry conduit 62 and slurry sub-conduits 62a and the bearing unit 53 has a cap 63.

Platen 41 is typically formed as a circular disc, e.g., of aluminum, covered by polishing pad 42, e.g., of polyurethane fibrous plastic sheeting material, and is carried on shaft 43 which is mounted via gear unit 44 on base 45 for rotation by motor 46 about a stationary platen axis 47 in conventional manner.

Polishing unit 51 includes support beam 52 which is mounted on a base (not shown) for back and forth oscillation, e.g., in a radial direction relative to platen axis 47, as indicated by oscillation arrow 52a. Support beam 52 carries bearing unit 53, gear unit 54 and motor 55 for common oscillation therewith. Spindle 56 is mounted at its top end 56a in bearing unit 53 and gear unit 54 for rotation by motor 55 about spindle axis (wafer axis) 57 and for common oscillation with support beam 52, in conventional manner. Carrier 58 is mounted at its upper portion 58a on bottom end 56b of spindle 56 for common rotation and oscillation therewith. Lower portion 58b of carrier 58 defines underside portion 58c which carries ring 59 for common rotation and oscillation therewith.

Ring 59 has a generally medial aperture 59a and a peripheral wear surface 59b perimetrically surrounding aperture 59a. Aperture 59a is adapted to retain therein for common movement with ring 59 in conventional manner a semiconductor wafer W, e.g., of silicon, having a surface WS to be chemically mechanically polished and a surface periphery WP. Wafer W is maintained in aperture 59a and against the underside portion 58c of carrier 58 such that wafer surface WS is in substantially flush coplanar relation with wear surface 59b and is peripherally surrounded at surface periphery WP by wear surface 59b.

Support beam 52 is arranged such that wafer W and wear surface 59b of ring 59 are maintained in common frictional contact with polishing pad 42 as they are commonly rotated, e.g., counter-clockwise, and commonly oscillated, e.g., in the direction of arrow 52a, and as platen 41 is rotated in like manner, e.g., also counter-clockwise, in conventional manner.

At the same time, i.e., during the relative periodic movement of ring 59 with respect to platen 41, slurry S is dispensed at a given flow rate in respective flows from a plurality of, e.g., four, perimetrically spaced apart channels 61 defined in wear surface 59b to wafer surface WS at corresponding adjacent portions of surface periphery WP in the vicinity of polishing pad 42. Thus, slurry S is dispensed at a plurality of perimetrically spaced apart points, i.e., at channels 61 in facing relation to wafer surface periphery WP, maintained in fixed relation to wafer surface WS in any position of movement of wafer W and ring 59 during the CMP operation.

For this purpose, carrier 58 is provided with a slurry conduit 62 extending, e.g., centrally axially along spindle axis 57, from its upper portion 58a to its lower portion 58b and which downwardly terminates in a plurality of, e.g., four, slurry sub-conduits 62a. The plurality of slurry sub-conduits 62a generally radially outwardly extend from slurry conduit 62 to underside portion 58c for corresponding flow communication with the like plurality of channels 61 in ring 59 at wear surface 59b.

Figure 5:
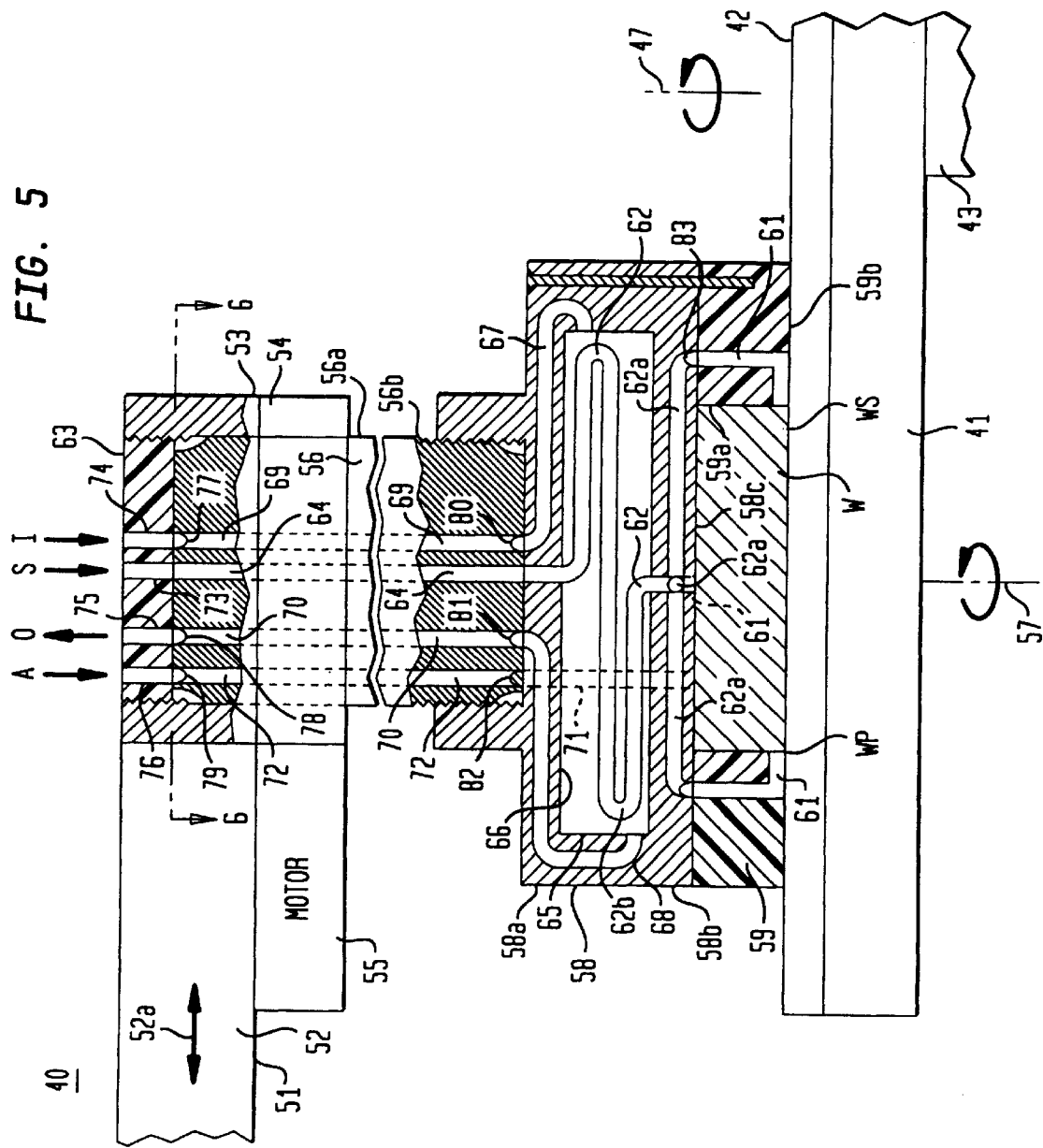
FIG. 5 is an enlarged side view, partially in section, of the apparatus of FIG. 3 illustrating particular details of construction.

Referring now more specifically to FIG. 5, it is seen that apparatus 40 additionally includes slurry conduit coils 62b, a slurry passage 64, a heat exchanger 65, a chamber 66, an inflow conduit 67, an outflow conduit 68, an inflow passage 69, an outflow passage 70, an air conduit 71, an air passage 72, a slurry bore 73, an inflow bore 74, an outflow bore 75, an air bore 76, and the grooves 77, 78, 79, 80, 81, 82 and 83.

Spindle 56 is provided with slurry passage 64 which extends, e.g., centrally axially along spindle axis 57, like slurry conduit 62 of carrier 58, from its top end 56a to its bottom end 56b and is arranged for alignment and flow communication with slurry conduit 62 of carrier 58. Cap 63 of bearing unit 53 is desirably axially adjustably attached, e.g., by screw threads, to the top portion of bearing unit 53 to make constant sliding seal contact with the top end 56a of rotating spindle 56 in conventional manner. Cap 63 is provided with slurry bore 73 which is positioned, e.g., centrally axially, and arranged for alignment and flow communication with slurry passage 64 of spindle 56.

Thus, although spindle 56 rotates with respect to non-rotating cap 63, slurry S may be fed from a non-rotatable supply (not shown) at a predetermined flow rate through slurry bore 73 of cap 63, slurry passage 64 of spindle 56, slurry conduit 62 and slurry sub-conduits 62a of carrier 58 to slurry channels 61 of ring 59, in any position of rotational movement of spindle 56 relative to bearing unit 53, and cap 63, for uniform dispensing to the immediately adjacent portions of wafer surface WS at wafer surface periphery WP for efficient CMP of wafer surface WS.

Desirably, carrier 58 also includes heat exchanger 65, e.g., formed as a chamber 66, with inflow conduit 67 extending from its upper portion 58a to chamber 66, outflow conduit 68 extending from chamber 66 to its upper portion 58a and slurry conduit 62 passing through chamber 66, e.g., in the form of one or more slurry conduit coils 62b of heat transfer material such as metal tubing, in indirect heat exchange relation to chamber 66 and inflow conduit 67 and outflow conduit 68.

In turn, spindle 56 has inflow passage 69 and outflow passage 70, each extending from its top end 56a to its bottom end 56b and arranged for corresponding flow communication with inflow conduit 67 and outflow conduit 68, respectively, of carrier 58. Cap 63 of bearing unit 53 has inflow bore 74 and outflow bore 75 arranged for corresponding flow communication with inflow passage 69 and outflow passage 70, respectively, of spindle 56.

Thus, although spindle 56 rotates with respect to non-rotating cap 63, temperature adjusting fluid, e.g., heated or cooled liquid, is fed as inflow I from a non-rotating circulating supply (not shown), e.g., at a predetermined flow rate and temperature, through inflow bore 74 of cap 63, inflow passage 69 of spindle 56 and inflow conduit 67 of carrier 58 to chamber 66 for indirect heat exchange with slurry S in slurry conduit 62, e.g., via heat transfer slurry conduit coils 62a. The temperature adjusting fluid is then returned from chamber 66 as outflow O via outlet conduit 68 of carrier 58, outflow passage 70 of spindle 56 and outflow bore 75 of cap 63 to the non-rotating circulating supply (not shown) for reheating or recooling, as the case may be, before being fed again to inflow bore 74.

This circulating flow of temperature adjusting fluid is thus fed as inflow I via inflow bore 74 to chamber 66 of heat exchanger 65 and returned as outflow O via outflow bore 75 therefrom in any position of rotational movement of spindle 56 relative to bearing unit 53, and cap 63, for uniform heat exchange temperature adjustment of slurry S just before it is dispensed via channels 61 of ring 59 for efficient CMP of wafer surface WS.

Conveniently, the circulating inflow I and outflow O of the temperature adjusting fluid is preheated or precooled external to carrier 58 yet within the confines of apparatus 40, such as in the vicinity of support beam 52 by suitable means such as a heating or cooling element (not shown) in conventional manner.

Polishing unit 51 also desirably has an air conduit 71 extending from upper portion 58a to lower portion 58b of carrier 58 and flow communicating with underside portion 58c of carrier 58 within the confines of aperture 59a of ring 59. Spindle 56 has air passage 72 extending from its top end 56a to its bottom end 56b and arranged in flow communication with air conduit 71 of carrier 58. Cap 63 of bearing unit 53 has air bore 76 arranged in flow communication with air passage 72 of spindle 56.

While spindle 56 rotates with respect to non-rotating cap 63, air, e.g., compressed air, or other pressure fluid A, is fed from a supply (not shown), e.g., at a predetermined pressure, through air bore 76 of cap 63, air passage 72 of spindle 56 and air conduit 71 of carrier 58 to underside portion 58c of carrier 58 for acting against the adjacent portion of wafer W retained in aperture 59a of ring 59 at underside portion 58c of carrier 58 to maintain wafer W in substantially flush coplanar relation with wear surface 59b of ring 59 in conventional manner.

This flow of air or other pressure fluid A is thus fed via air bore 76 to underside portion 58c of carrier 58 in any position of rotational movement of spindle 56 relative to bearing unit 53, and cap 63, for uniform maintenance of wafer surface WS in substantially flush coplanar relation with wear surface 59b of ring 59 for efficient CMP of wafer surface WS.

Since spindle 56 rotates while cap 63 is non-rotatable, the top surface of spindle 56 is suitably provided with three concentric circular grooves about axial slurry passage 64. These include inner inflow groove 77 in radial alignment with inflow passage 69, middle outflow groove 78 in radial alignment with outflow passage 70 and outer air groove 79 in radial alignment with air passage 72.

Figure 6:
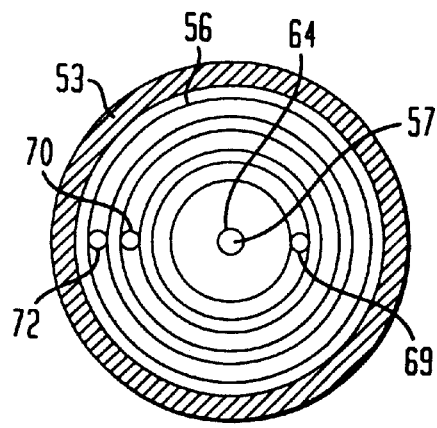
FIG. 6 is a top sectional view on line 6—6 of FIG. 5.

Referring now more specifically to FIG. 6, it is seen that inflow groove 77, outflow groove 78 and air groove 79 at the top end 56a of spindle 56 are concentric to central slurry passage 64 and are so aligned with regard to inflow passage 69, outflow passage 70 and air passage 72, respectively, that inflow bore 74, outflow bore 75 and air bore 76 in cap 63 are correspondingly in constant flow communication via grooves 77, 78 and 79, respectively, with inflow passage 69, outflow passage 70 and air passage 72, respectively, in any position of rotational movement of spindle 56 relative to cap 63.

Referring again to FIG. 5, it is seen that the bottom surface of spindle 56 has a similar set of three concentric circular grooves about axial slurry passage 64. These include inner inflow groove 80 in radial alignment with inflow passage 69, middle outflow groove 81 in radial alignment with outflow passage 70 and outer air groove 82 in radial alignment with air passage 72. Inflow groove 80, outflow groove 81 and air groove 82 in the bottom end 56b of spindle 56 are concentric to central slurry passage 64 and are so aligned with regard to inflow passage 69, outflow passage 70 and air passage 72, respectively, that inflow conduit 69, outflow conduit 68 and air conduit 71 in carrier 58 are correspondingly in constant flow communication via grooves 80, 81 and 82, respectively, with inflow passage 69, outflow passage 70 and air passage 72, respectively, in any angular rotational position of spindle 56 relative to carrier 58.

Underside portion 58c of carrier 58 has a similar concentric circular slurry groove 83 defined therein in alignment with axial slurry passage 64 in spindle 56 and the upper portion of slurry conduit 62 adjacent thereto in carrier 58. Slurry groove 83 is in common alignment with each of the plurality of slurry sub-conduits 62a extending from slurry conduit 62 to underside portion 58c of carrier 58. Thus, sub-conduits 62a of carrier 58 are correspondingly in constant flow communication via groove 83 with channels 61 in ring 59 in any angular rotational position of ring 59 relative to carrier 58.

In as much as slurry bore 73 in cap 63, slurry passage 64 in spindle 56 and slurry conduit 62 in carrier 58 are in coaxial alignment, they are inherently in constant flow communication with each other in any angular rotational position of spindle 56 and carrier 58 relative to cap 63.

Carrier 58 may be connected to spindle 56 for common movement therewith by any suitable connecting means such as screws or the like. However, if spindle 56 and carrier 58 are provided as an integral unit (not shown), grooves 80, 81 and 82 in the bottom surface of spindle 56 may be omitted since in this case inflow passage 69 and inflow conduit 67 will be integral with each other, outflow passage 70 and outflow conduit 68 will be integral with each other and air passage 72 and air conduit 71 will be integral with each other.

Alternatively, if spindle 56 is provided as a hollow tube (not shown), passages 64, 69, 70 and 72 may take the form of, e.g., plastic, tubing extending through the hollow tube spindle and mounted in upper and lower end caps on the hollow tube (not shown), in similar manner to cap 63 relative to bearing unit 53.

Ring 59 may also be mounted on carrier 58 for common movement therewith by any suitable connecting means such as screws or the like. However, if ring 59 is mounted on carrier 58 such that the plurality of wear surface channels 61 are in corresponding individual angular rotational alignment and flow communication with the equal plurality of slurry sub-conduits 62a of carrier 58, respectively then groove 83 in underside portion 58c of carrier 58 may be omitted.

Figure 7:
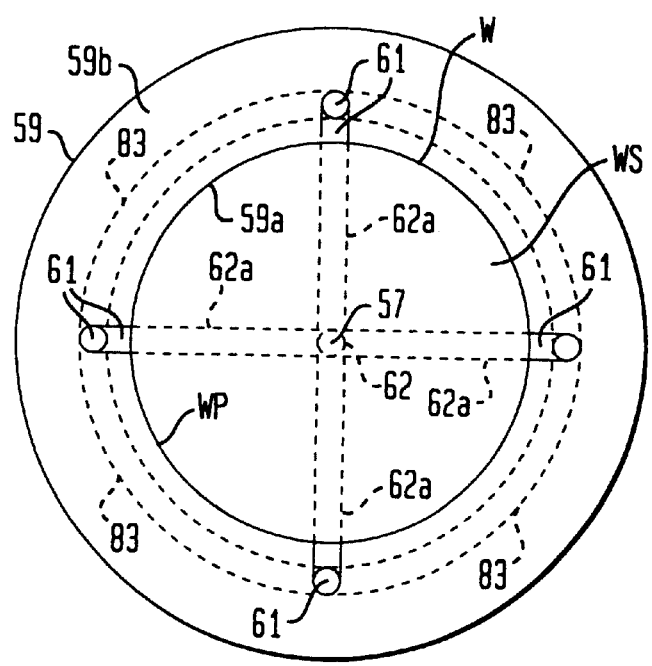
FIG. 7 is a bottom view of part of the apparatus of FIG. 5.

Referring now more specifically to FIG. 7, it is seen that during relative periodic movement of ring 59 with respect to platen 41, slurry S is dispensed at a predetermined flow rate uniformly in respective flows from the perimetrically spaced apart channels 61 in wear surface 59b which radially inwardly face wafer surface periphery WP. Hence, slurry S is immediately dispensed to wafer surface WS at corresponding adjacent portions of surface periphery WP. Slurry S is thereby uniformly dispensed at a plurality of perimetrically spaced apart points at channels 61 which are in facing relation to surface periphery WP and in fixed relation to wafer surface WS in any position of movement of wafer W and ring 59 during the CMP operation.

Slurry S readily reaches channels 61 in ring 59 via slurry sub-conduits 62a which extend radially outwardly from axially located slurry conduit 62 to groove 83 in carrier 58, as shown in dashed line in FIG. 7. Groove 83 in carrier 58 is in constant flow connection with channels 61 in ring 59.

Slurry S is typically dispensed via wear surface channels 61 at a flow rate of about 100–200 mL/min. Platen 41 is rotated at about 25–100 rpm and ring 59 and wafer W are commonly rotated at about 25–100 rpm and within a differential of about 5 rpm of the speed of rotation of platen 41. At the same time, ring 59 and wafer W are also oscillated at a frequency of about 3–8 cpm, e.g., about 5 cpm, and at an amplitude of about 10–30 mm, e.g., about 20 mm. The polishing time of the CMP operation is generally about 1–5 minutes in duration.

Wafer W is typically of circular disc shape with a diameter of about 8 inches (200 mm), and formed of silicon. Ring 59 has a conforming circular aperture 59a also about 8 inches in diameter, and such that a gap of at most about 1 mm exists between the wafer periphery and the confining inner wall portion of ring 59 defining aperture 59a. The annular portion of ring 59 defining wear surface 59b is typically about 2 inches in radial extent, whereby the outer diameter of ring 59 is about 10 inches and its outer circumference is about 31.4 inches. Platen 41 typically has a diameter of about 20 inches and a circumference of about 62.8 inches.

Bores 73, 74, 75 and 76, passages 64, 69, 70 and 72, and conduits 62, 67, 68 and 71 typically each have a diameter of about ¼ inch. On the other hand, sub-conduits 62a and wear surface channels 61 each have a correspondingly smaller diameter such that the collective flow cross section, and thus flow of slurry S, in all of the sub-conduits 62a and concordantly exiting from all of the wear surface channels 61 is approximately equal to the total flow cross section, and thus total flow of slurry S, in slurry conduit 62.

Slurry S may be any suitable chemical mechanical polishing liquid such as a caustic aqueous slurry containing finely divided abrasive particles, e.g., an aqueous potassium hydroxide (KOH) slurry containing colloidal silica as the abrasive material, an aqueous ferric nitrate slurry containing colloidal alumina as the abrasive material, an aqueous aluminum sulfate solution containing colloidal silica as the abrasive, or the like. For example, slurry S may be a 15% KOH aqueous solution (in 85% water) containing colloidal silica particles of about 0.2 micron average particle diameter.

Typically, slurry S is dispensed at a temperature of about 15–50° C. and wafer surface WS is maintained in frictional contact with polishing pad 42 under a mechanical pressure (down force), e.g., of about 2–8 psi, such as about 5 psi, per the action of compressed air A exiting air conduit 71 at underside portion 58c of carrier 58 in conventional manner. Similarly, ring 59 is maintained in frictional contact at wear surface 59b with polishing pad 42, either without applying positive mechanical pressure thereto or under a mechanical pressure (down force), e.g., of about 2–10 psi, such as about 5 psi, per the downwardly pressing action of support beam 52 on spindle 56, carrier 58 and ring 59 in conventional manner.

Since channels 61 in ring 59 are in immediately facing adjacent relation to wafer surface periphery WP and centrally within the annular extent of wear surface 59b, slurry S is not prevented by ring 59 from reaching the central area portion of wafer surface WS, nor is it pushed off of polishing pad 42 by the outer circumferential portion of ring 59, thereby overcoming the pertinent prior art drawbacks noted above.

Ring 59 is typically formed of selectively sacrificially consumable plastic or ceramic abradable material in conventional manner, i.e., so as to undergo removal of material from wear surface 59b thereof at a rate substantially matching the removal rate of material from wafer surface WS. Polishing pad 41 is commercially available as a polyurethane fibrous sheeting material designated IC 1000 (Rodel Inc., Del.).

Heat exchanger 65 is typically supplied with heated liquid, e.g., at a uniform flow rate of about 100–250 mL/min., such as hot glycol or hot water which is heated to about 25–50° C. in conventional manner, e.g., at a remote location on apparatus 40, and fed as inflow I to heat exchanger 65 via inflow bore 74 and returned as outflow O via outflow bore 75 for reheating. However, the liquid fed to heat exchanger 65 may be cold liquid such as cold glycol or cold water, e.g., at about 15–20° C., where it is desired to maintain wafer W at a cool or cold temperature, depending on the particular CMP operation.

The present invention thus provides a system for minimizing variation in the local removal rates of material from different parts of wafer W caused by variation in the amount and temperature of the slurry S actually coming into contact with the wafer surface WS being polished. This improves the within-wafer uniformity. The dispensing of slurry S from ring 59 to wafer W retained thereby, instead of from a remote stationary tube, inherently reduces consumption of slurry S to a minimum.

By feeding slurry S through spindle 56 and carrier 58 to ring 59 and dispensing it from channels 61 in ring 59, it is introduced in immediate adjacency to wafer W during common rotation and oscillation of wafer W and ring 59. Slurry S is supplied very close to wafer W in the same relative position from spaced apart channels 61 in ring 59, i.e., irrespective of the rotational and/or oscillational movement position of wafer W and ring 59.

This dispensing of slurry S at the immediate site of use for CMP of wafer W minimizes any change, e.g., drop, in the slurry temperature from its predetermined temperature (set point) before slurry S contacts wafer W. Slurry S thus has a vastly improved chance of reaching the central portion of wafer surface WS so as to provide a concordantly improved degree of uniformity and rate of removal, especially for temperature sensitive CMP processes, while minimizing slurry usage and wastage. Due to the direct manner of feeding slurry S to wafer W within the confines of ring 59, it desirably maintains its predetermined uniform pH.

The system of the present invention also eliminates the need for a stand-alone slurry temperature adjusting, e.g., heating, module or heat exchanger, thus conserving floor space. Instead, heat exchanger 65 is located in carrier 58 immediately adjacent ring 59 and its dispensing channels 61 so as to provide slurry S immediately to wafer W without possible intervening undesired temperature change. The circulating inflow I and outflow O of the temperature adjusting fluid can be readily preheated or precooled external to carrier 58 but still within the confines of apparatus 40, e.g., in the vicinity of support beam 52 by suitable means (not shown) in conventional manner.

Thus, the entire temperature adjusting operation can be effected without increasing the predetermined floor space (footprint) already occupied by apparatus 40.

It is clear that the system of the present invention is applicable to all CMP processes, with suitable attendant optimization depending on the pertinent temperature and flow rate sensitivity of the slurry S. In all cases, the CMP method can be carried out in apparatus 40 so as to maintain slurry S at a uniform flow rate, uniform temperature and uniform pH, and thus achieve uniform CMP of wafer W in a reproducible manner as desired in accordance with the present invention.

Accordingly, it can be appreciated that the specific embodiments described are merely illustrative of the general principles of the invention. Various modifications may be provided consistent with the principles set forth.

What is claimed is:

1. An apparatus for chemical mechanical polishing of a surface of a semiconductor wafer having a surface periphery, the apparatus comprising:

a retaining ring having a medial aperture and a peripheral wear surface perimetrically surrounding the aperture, the aperture being adapted to retain therein for common movement with the ring a semiconductor wafer having a surface to be chemically mechanically polished, such that the wafer surface is in substantially flush coplanar relation with the wear surface and is peripherally surrounded by the wear surface; and a plurality of perimetrically spaced apart channels defined in the wear surface for dispensing respective flows of a chemical mechanical polishing liquid to the corresponding adjacent portions of the periphery of the wafer surface.

2. The apparatus of claim 1 wherein the ring is formed of sacrificially consumable plastic or ceramic abradable material.

3. An apparatus for chemical mechanical polishing of a surface of a semiconductor wafer having a surface periphery, the apparatus comprising:

a carrier adapted to be mounted for relative periodic movement with respect to a substantially flat polishing surface and having an upper portion, a lower portion defining an underside portion and a polishing liquid conduit extending from the upper portion to the lower portion thereof;

a retaining ring mounted on the underside portion of the carrier for common movement therewith and having a medial aperture and a peripheral wear surface perimetrically surrounding the aperture, the aperture being adapted to retain therein for common movement with the ring a semiconductor wafer having a surface to be chemically mechanically polished, such that the wafer surface is in substantially flush coplanar relation with the wear surface and is peripherally surrounded by the wear surface; and a plurality of perimetrically spaced apart channels defined in the wear surface for dispensing respective flows of a chemical mechanical polishing liquid to the corresponding adjacent portions of the periphery of the wafer surface, the channels being arranged in common flow communication with the polishing liquid conduit of the carrier.

4. The apparatus of claim 3 wherein the ring is formed of sacrificially consumable plastic or ceramic abradable material.

5. The apparatus of claim 3 further comprising temperature adjusting means in the carrier for selectively adjusting the temperature of a flow of polishing liquid in the polishing liquid conduit.

6. The apparatus of claim 3 further comprising heat exchanger means in the carrier for selectively adjusting the temperature of a flow of polishing liquid in the polishing liquid conduit, and a temperature adjusting fluid inflow conduit extending from the upper portion of the carrier to the heat exchanger means and a temperature adjusting fluid outflow conduit extending from the heat exchanger means to the upper portion of the carrier for passing a flow of temperature adjusting fluid in indirect heat exchange relation to the flow of polishing liquid in the polishing liquid conduit for such temperature adjustment.

7. An apparatus for chemical mechanical polishing of a surface of a semiconductor wafer having a surface periphery, the apparatus comprising:

a spindle adapted to be mounted for relative periodic movement with respect to a substantially flat polishing surface and having a top end, a bottom end and a polishing liquid passage extending from the top end to the bottom end thereof;

a carrier mounted on the bottom end of the spindle for common movement therewith and having an upper portion in contact with the bottom end of the spindle, a lower portion defining an underside portion and a polishing liquid conduit extending from the upper portion to the lower portion thereof and being in flow communication with the polishing liquid passage of the spindle;

a retaining ring mounted on the underside portion of the carrier for common movement therewith and having a medial aperture and a peripheral wear surface perimetrically surrounding the aperture, the aperture being adapted to retain therein for common movement with the ring a semiconductor wafer having a surface to be chemically mechanically polished, such that the wafer surface is in substantially flush coplanar relation with the wear surface and is peripherally surrounded by the wear surface; and a plurality of perimetrically spaced apart channels defined in the wear surface for dispensing respective flows of a chemical mechanical polishing liquid to the corresponding adjacent portions of the periphery of the wafer surface, the channels being arranged in common flow communication with the polishing liquid conduit of the carrier.

8. The apparatus of claim 7 wherein the ring is formed of sacrificially consumable plastic or ceramic abradable material.

9. The apparatus of claim 7 further comprising temperature adjusting means in the carrier for selectively adjusting the temperature of a flow of polishing liquid in the polishing liquid conduit.

10. An apparatus for chemical mechanical polishing of a surface of a semiconductor wafer having a surface periphery, the apparatus comprising:

a spindle adapted to be mounted for relative periodic movement with respect to a substantially flat polishing surface and having a top end, a bottom end, a polishing liquid passage, a temperature adjusting fluid inflow passage and a temperature adjusting fluid outflow passage, each of said passages extending from the top end to the bottom end of the spindle;

a carrier mounted on the bottom end of the spindle for common movement therewith and having an upper portion in contact with the bottom end of the spindle, a lower portion defining an underside portion, heat exchanger means, a polishing liquid conduit extending from the upper portion of the carrier through the heat exchanger means to the lower portion of the carrier and being in flow communication with the polishing liquid passage of the spindle, a temperature adjusting fluid inflow conduit extending from the upper portion of the carrier to the heat exchanger means and being in flow communication with the fluid inflow passage of the spindle, and a temperature adjusting fluid outflow conduit extending from the heat exchanger means to the upper portion of the carrier and being in flow communication with the fluid outflow passage of the spindle, the heat exchanger means being arranged for passing a flow of temperature adjusting fluid via the fluid inflow passage and fluid inflow conduit and in turn the fluid outflow conduit and fluid outflow passage in indirect heat exchange relation to the flow of polishing liquid in the polishing liquid conduit for selectively adjusting the temperature of the polishing liquid in the carrier;

a retaining ring mounted on the underside portion of the carrier for common movement therewith and having a medial aperture and a peripheral wear surface perimetrically surrounding the aperture, the aperture being adapted to retain therein for common movement with the ring a semiconductor wafer having a surface to be chemically mechanically polished, such that the wafer surface is in substantially flush coplanar relation with the wear surface and is peripherally surrounded by the wear surface; and a plurality of perimetrically spaced apart channels defined in the wear surface for dispensing respective flows of a chemical mechanical polishing liquid to the corresponding adjacent portions of the periphery of the wafer surface, the channels being arranged in common flow communication with the polishing liquid conduit of the carrier.

11. The apparatus of claim 10 wherein the ring is formed of sacrificially consumable plastic or ceramic abradable material.

12. The apparatus of claim 10 further comprising a pressure fluid passage extending from the top end to the bottom end of the spindle, and a pressure fluid conduit extending from the upper portion to the lower portion of the carrier and flow communicating with the pressure fluid passage of the spindle and with the underside portion of the carrier within the confines of the aperture of the ring for feeding a flow of pressure fluid to the adjacent portion of a semiconductor wafer retained in the aperture at the underside portion of the carrier for maintaining the wafer in substantially flush coplanar relation with the wear surface of the ring.

13. An apparatus for chemical mechanical polishing of a surface of a semiconductor wafer having a surface periphery, the apparatus comprising:

a circular platen mounted for rotation about a platen axis and having a substantially flat polishing surface;

a spindle having a top end, a bottom end and a polishing liquid passage extending from the top end to the bottom end thereof;

a support beam arranged for oscillation in a direction toward and away from the platen axis and rotatably mounting the spindle at its top end for rotation about a spindle axis spaced from and substantially parallel to the platen axis;

a carrier mounted on the bottom end of the spindle for common movement therewith and having an upper portion in contact with the bottom end of the spindle, a lower portion defining an underside portion and a polishing liquid conduit extending from the upper portion to the lower portion thereof and being in flow communication with the polishing liquid passage of the spindle;

a retaining ring mounted on the underside portion of the carrier for common movement therewith and having a medial aperture and a peripheral wear surface perimetrically surrounding the aperture, the aperture being adapted to retain therein for common movement with the ring a semiconductor wafer having a surface to be chemically mechanically polished, such that the wafer surface is in substantially flush coplanar relation with the wear surface and is peripherally surrounded by the wear surface; and a plurality of perimetrically spaced apart channels defined in the wear surface for dispensing respective flows of a chemical mechanical polishing liquid to the corresponding adjacent portions of the periphery of the wafer surface, the channels being arranged in common flow communication with the polishing liquid conduit of the carrier;

the support beam being adjustably arranged to place the wear surface of the ring in frictional contact with the polishing surface of the platen for chemical mechanical polishing of a surface of a semiconductor wafer retained in the ring aperture during relative periodic movement of the wafer and ring with respect to the platen under rotation of the platen and common rotation and oscillation of the wafer and ring.

14. The apparatus of claim 13 wherein the ring is formed of sacrificially consumable plastic or ceramic abradable material.

15. The apparatus of claim 13 further comprising flow connection means for supplying a flow of polishing liquid from a non-rotating supply to the polishing liquid passage of the spindle during rotation and oscillation of the spindle.

16. The apparatus of claim 13 further comprising a pressure fluid passage extending from the top end to the bottom end of the spindle, and a pressure fluid conduit extending from the upper portion to the lower portion of the carrier and flow communicating with the pressure fluid passage of the spindle and with the underside portion of the carrier within the confines of the aperture of the ring for feeding a flow of pressure fluid to the adjacent portion of a semiconductor wafer retained in the aperture at the underside portion of the carrier for maintaining the wafer in substantially flush coplanar relation with the wear surface of the ring.

17. The apparatus of claim 16 further comprising flow connection means for supplying a flow of polishing liquid from a non-rotating supply to the polishing liquid passage of the spindle and a flow of pressure fluid from a non-rotating supply to the pressure fluid passage of the spindle during rotation and oscillation of the spindle.

18. An apparatus for chemical mechanical polishing of a surface of a semiconductor wafer having a surface periphery, the apparatus comprising:

a circular platen mounted for rotation about a platen axis and having a substantially flat polishing surface;

a spindle having a top end, a bottom end, a polishing liquid passage, a temperature adjusting fluid inflow passage and a temperature adjusting fluid outflow passage, each of said passages extending from the top end to the bottom end of the spindle;

a support beam arranged for oscillation in a direction toward and away from the platen axis and rotatably mounting the spindle at its top end for rotation about a spindle axis spaced from and substantially parallel to the platen axis;

a carrier mounted on the bottom end of the spindle for common movement therewith and having an upper portion in contact with the bottom end of the spindle, a lower portion defining an underside portion, heat exchanger means, a polishing liquid conduit extending from the upper portion of the carrier through the heat exchanger means to the lower portion of the carrier and being in flow communication with the polishing liquid passage of the spindle, a temperature adjusting fluid inflow conduit extending from the upper portion of the carrier to the heat exchanger means and being in flow communication with the fluid inflow passage of the spindle, and a temperature adjusting fluid outflow conduit extending from the heat exchanger means to the upper portion of the carrier and being in flow communication with the fluid outflow passage of the spindle, the heat exchanger means being arranged for passing a flow of temperature adjusting fluid via the fluid inflow passage and fluid inflow conduit and in turn the fluid outflow conduit and fluid outflow passage in indirect heat exchange relation to the flow of polishing liquid in the polishing liquid conduit for selectively adjusting the temperature of the polishing liquid in the carrier;

a retaining ring mounted on the underside portion of the carrier for common movement therewith and having a medial aperture and a peripheral wear surface perimetrically surrounding the aperture, the aperture being adapted to retain therein for common movement with the ring a semiconductor wafer having a surface to be chemically mechanically polished, such that the wafer surface is in substantially flush coplanar relation with the wear surface and is peripherally surrounded by the wear surface; and a plurality of perimetrically spaced apart channels defined in the wear surface for dispensing respective flows of a chemical mechanical polishing liquid to the corresponding adjacent portions of the periphery of the wafer surface, the channels being arranged in common flow communication with the polishing liquid conduit of the carrier;

the support beam being adjustably arranged to place the wear surface of the ring in frictional contact with the polishing surface of the platen for chemical mechanical polishing of a surface of a semiconductor wafer retained in the ring aperture during relative periodic movement of the wafer and ring with respect to the platen under rotation of the platen and common rotation and oscillation of the wafer and ring.

19. The apparatus of claim 18 wherein the ring is formed of sacrificially consumable plastic or ceramic abradable material.

20. The apparatus of claim 18 further comprising flow connection means for supplying a flow of polishing liquid from a non-rotating supply to the polishing liquid passage of the spindle, for supplying an inflow of temperature adjusting fluid from a non-rotating supply to the fluid inflow passage of the spindle and for removing an outflow of such temperature adjusting fluid from the fluid outflow passage of the spindle to a non-rotating outlet, during rotation and oscillation of the spindle.

21. The apparatus of claim 20 further comprising a pressure fluid passage extending from the top end to the bottom end of the spindle, and a pressure fluid conduit extending from the upper portion to the lower portion of the carrier and flow communicating with the pressure fluid passage of the spindle and with the underside portion of the carrier within the confines of the aperture of the ring for feeding a flow of pressure fluid to the adjacent portion of a semiconductor wafer retained in the aperture at the underside portion of the carrier for maintaining the wafer in substantially flush coplanar relation with the wear surface of the ring.

22. The apparatus of claim 21 further comprising flow connection means for supplying a flow of pressure fluid from a non-rotating supply to the pressure fluid passage of the spindle during rotation and oscillation of the spindle.

* * * * *